United States Patent
Bao et al.

(10) Patent No.: US 10,808,172 B2
(45) Date of Patent: Oct. 20, 2020

(54) PEROVSKITE LUMINESCENT NANOCRYSTAL, LIGHT EMITTING DEVICE, AND MANUFACTURING METHOD FOR PEROVSKITE LUMINESCENT NANOCRYSTAL

(71) Applicant: Lextar Electronics Corporation, Hsinchu (TW)

(72) Inventors: Zhen Bao, Hsinchu (TW); Yu-Jui Tseng, Hsinchu (TW); Ru-Shi Liu, Hsinchu (TW); Hung-Chun Tong, Hsinchu (TW); Hung-Chia Wang, Hsinchu (TW); Yu-Chun Lee, Hsinchu (TW); Tzong-Liang Tsai, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/566,903

(22) Filed: Sep. 11, 2019

(65) Prior Publication Data
US 2020/0248070 A1    Aug. 6, 2020

(30) Foreign Application Priority Data
Jan. 31, 2019    (CN) .......................... 2019 1 0100058

(51) Int. Cl.
*H01L 33/50* (2010.01)
*C09K 11/66* (2006.01)
*C01G 21/00* (2006.01)

(52) U.S. Cl.
CPC .......... *C09K 11/665* (2013.01); *C01G 21/006* (2013.01); *H01L 33/502* (2013.01);
(Continued)

(58) Field of Classification Search
CPC ........................... H01L 33/502; C09K 11/665
See application file for complete search history.

(56) References Cited

U.S. PATENT DOCUMENTS

2010/0015446 A1* 1/2010 Wolk ...................... B01J 35/006
428/402
2016/0380136 A1* 12/2016 Ning .................. C04B 35/5152
252/519.4
(Continued)

FOREIGN PATENT DOCUMENTS

CN    108002430 A    5/2018
CN    108483487 A    9/2018

OTHER PUBLICATIONS

Yuhai Zhang et al., "Zero-Dimensional Cs4PbBr6 Perovskite Nanocrystals" J. Phys. Chem. Lett., 2017, 8 (5), pp. 961-965.
(Continued)

*Primary Examiner* — George R Fourson, III
(74) *Attorney, Agent, or Firm* — CKC & Partners Co., LLC

(57) ABSTRACT

A perovskite luminescent nanocrystal has a chemical formula represented by: $Cs_4BX_6$, wherein B includes one or more selected from the group consisting of Ge, Pb, Sn, Sb, Bi, Cu, and Mn, and X includes one or more selected from the group consisting of Cl, Br, and I, wherein the $Cs_4BX_6$ perovskite luminescent nanocrystal has a pure phase, and a molar ratio of Cs to B (Cs/B) in the $Cs_4BX_6$ perovskite luminescent nanocrystal is greater than 1 and less than 4.

18 Claims, 11 Drawing Sheets

(52) U.S. Cl.
CPC ...... *C01P 2002/34* (2013.01); *C01P 2002/60* (2013.01); *C01P 2002/72* (2013.01); *C01P 2002/74* (2013.01); *C01P 2002/77* (2013.01); *C01P 2004/03* (2013.01); *C01P 2004/04* (2013.01); *C01P 2004/62* (2013.01); *C01P 2004/64* (2013.01); *C01P 2006/60* (2013.01); *H01L 2933/0041* (2013.01)

(56) References Cited

U.S. PATENT DOCUMENTS

| | | | |
|---|---|---|---|
| 2017/0217785 A1* | 8/2017 | Yang | H01L 21/02422 |
| 2019/0062175 A1* | 2/2019 | Gao | C07F 7/24 |
| 2019/0169498 A1* | 6/2019 | Saidaminov | C09K 11/665 |
| 2019/0330527 A1* | 10/2019 | Saidaminov | C09K 11/665 |
| 2020/0013976 A1* | 1/2020 | Zhong | H01L 51/0077 |
| 2020/0144438 A1* | 5/2020 | Wang | H01L 22/10 |

OTHER PUBLICATIONS

Junwei Xu et al., "Imbedded Nanocrystals of CsPbBr3 in Cs4PbBr6: Kinetics, Enhanced Oscillator Strength, and Application in Light-Emitting Diodes" Adv. Mater. 2017, 29 (43), 1703703.

Xiaomei Chen et al., "Centimeter-Sized Cs4PbBr6 Crystals with Embedded CsPbBr3 Nanocrystals Showing Superior Photoluminescence: Nonstoichiometry Induced Transformation and Light-Emitting Applications" Adv. Funct. Mater, 2018, 1706567.

Protesescu, L. et al., "Nanocrystals of Cesium Lead Halide Perovskites (CsPbX3, X=Cl, Br, and I): Novel Optoelectronic Materials Showing Bright Emission with Wide Color Gamut" Nano Lett. 2015, 15 (6), 3692-3696.

Akkerman, Q. A. et al., "Nearly Monodisperse Insulator Cs4PbX6 (X=Cl, Br, I) Nanocrystals, Their Mixed Halide Compositions, and Their Transformation into CsPbX3 Nanocrystals" Nano Lett. 2017, 17 (3), 1924-1930.

De Bastiani, M. et al., "Inside Perovskites: Quantum Luminescence from Bulk Cs4PbBr6 Single Crystals" Chem. Mater. 2017, 29 (17), 7108-7113.

Chen et al., "Large-scale room-temperature synthesis and optical properties of perovskite-related Cs4PbBr6 fluorophores.", Journal of Materials Chemistry C, vol. 4, Issue 45, Oct. 24, 2016, p. 10646-10653.

Zhang et al., "Ligand-free nanocrystals of highly emissive Cs4PbBr6 perovskite.", The Journal of Physical Chemistry C, vol. 122, Issue 11, Feb. 23, 2018, p. 6493-6498.

* cited by examiner

PEROVSKITE LUMINESCENT NANOCRYSTAL, LIGHT EMITTING DEVICE, AND MANUFACTURING METHOD FOR PEROVSKITE LUMINESCENT NANOCRYSTAL

RELATED APPLICATIONS

This application claims priority to China Application Serial Number 201910100058.6, filed Jan. 31, 2019, which is herein incorporated by reference.

BACKGROUND

Field of Invention

The present invention relates to a perovskite luminescent nanocrystal, a light emitting device, and a manufacturing method for a perovskite luminescent nanocrystal.

Description of Related Art

In recent years, electronic products, such as mobile phones, televisions, tablets and watches, have increasingly higher requirements for displays, and they pursue to achieve advantages including high resolution, high color saturation, low power consumption and flexibility. At present, research fields of luminescent materials are wide, and researches related to nano luminescent materials have gradually received much attention in recent years.

However, past researches of nano luminescent materials mainly include cadmium-containing and cadmium-free quantum dots. The cadmium-containing quantum dots (for example, CdSe) have the advantages in a relatively higher quantum efficiency and a relatively narrower full width at half maximum (FWHM). However, because the cadmium-containing materials are not suitable in terms of the green trend of environmental protection, researches on cadmium-free quantum dots, such as indium phosphide (InP) and copper indium sulfide ($CuInS_2$) quantum dots, have gradually become more attractive in recent years. Because copper indium sulfide quantum dots possess excessively wide FWHM, they are more suitable for the white-light illumination application. On the other hand, indium phosphide quantum dots are suitable for backlit display devices because of their narrow FWHM. However, the luminous efficiency of indium phosphide quantum dots is not satisfactory.

In addition, perovskite nanocrystals are quantum dot materials that have gained much attention in recent years. They have excellent luminous efficiency and extremely narrow FWHM, and the emission wavelength can be easily changed by adjusting the halogen component. Perovskite nanocrystal $Cs_4BX_6$ is a nano luminescent material with great improvement in the stability of the perovskite structure, as compared with the traditional perovskite nanocrystal $CsBX_3$. Therefore, many researchers have focused on $Cs_4BX_6$ in recent years. However, the luminescent mechanism of $Cs_4BX_6$ is still controversial, and the scholars of various factions continue to carry out researches and debates on this structure.

In 2016, Zhang et al. synthesized $Cs_4PbBr_6$ nanocrystals by a microemulsion method, and the $Cs_4PbBr_6$ nanocrystals were identified by energy-dispersive X-ray spectroscopy (EDS). The ratio of Cs:Pb:Br is 4.6:1:6.5. The reason why the ratio of Cs is excessively high is that CsBr is formed on surfaces of the $Cs_4PbBr_6$ nanocrystals (with reference to the journal paper, "Zero-Dimensional $Cs_4PbBr_6$ Perovskite Nanocrystals" by Yuhai Zhang et al., J. Phys. Chem. Lett., 2017, 8 (5), pp 961-965).

In 2017, Junwei Xu et al. invented Cs—Pb—Br perovskite, and it was proved that $CsPbBr_3$ is embedded in $Cs_4PbBr_6$ crystals by synchrotron X-Ray diffraction (XRD) and selected area diffraction (SAED). It is also explained that the illuminating mechanism is that after $Cs_4PbBr_6$ (with a wide band-gap) absorbs ultraviolet light, the electrons and holes are transferred to the $CsPbBr_3$ (with a narrow band-gap), and then the electron-hole pairs are recombined to emit visible light. However, this material has disadvantage in low luminous efficiency (with reference to the journal paper, "Imbedded Nanocrystals of $CsPbBr_3$ in $Cs_4PbBr_6$: Kinetics, Enhanced Oscillator Strength, and Application in Light-Emitting Diodes" by Junwei Xu et al., Adv. Mater. 2017, 29 (43), 1703703).

In the next year, 2018, Chen et al. synthesized the centimeter-scale $Cs_4PbBr_6$ crystals capable of emitting green light by a slow cooling method, but found that XRD could not identify the existence of $CsPbBr_3$ phase. Therefore, it can be explained with that the $Pb^{2+}$ defects in $Cs_4PbBr_6$ crystals lead to the existing of $CsPbBr_3$ in the crystals of $Cs_4PbBr_6$, and then the structure of $CsPbBr_3$ is embedded in the crystals of $Cs_4PbBr_6$. A high resolution transmission electron microscopy (HRTEM) was also utilized to prove that the $CsPbBr_3$ phase exists in the $Cs_4PbBr_6$ crystals. However, the fatal disadvantage of this centimeter-scale crystal is that its crystal size is too large to be applied to chip-type light-emitting diodes (LEDs), especially sub-millimeter light-emitting diodes (Mini LEDs) and micro light-emitting diodes (Micro LEDs) (with reference to the journal paper, "Centimeter-Sized $Cs_4PbBr_6$ Crystals with Embedded $CsPbBr_3$ Nanocrystals Showing Superior Photoluminescence: Nonstoichiometry Induced Transformation and Light-Emitting Applications" by Xiaomei Chen. et al., Adv. Funct. Mater, 2018).

Published China patent CN 108002430A discloses a preparation method of small-sized and highly stable $Cs_4PbBr_6$ perovskite nanocrystals, but the preparation method is complex. First, 3.8 mn~11.8 mn $CsPbBr_3$ perovskite nanocrystals are synthesized by a high temperature method at 140° C.-200° C. Thereafter, ammonium bromide solution is injected into the system after the temperature is re-raised to 25° C.-120° C. After a reaction period of 3 to 8 minutes, a centrifugation process is performed to obtain $Cs_4PbBr_6$ nanocrystals. This is a two-step synthesis, and is laborious and not easy to be carried out.

Published China patent CN 108483487A discloses a preparation method of $Cs_4PbBr_6$ perovskite nanocrystals capable of controlling size and morphology, but the synthetic method used is very complex, i.e., a high temperature hot injection method. After synthesizing $CsPbBr_3$ nanoclusters, the $CsPbBr_3$ nanoclusters are injected into the cesium carboxylate solution at a high temperature to synthesize 9.8-22 nm $Cs_4PbBr_6$ perovskite nanocrystals, i.e., two-step method. Currently, the luminescence center of $Cs_4PbX_6$ crystal was proposed by $CsPbX_3$ impure phase generated in the $Cs_4PbX_6$ crystal, and the existence of $CsPbX_3$ impure phase is proved by XRD or HRTEM. However, this $CsPbX_3$ impure phase causes a decrease in quantum efficiency. Therefore, it is very important to synthesize a pure-phased Cs4PbX6 luminescent nanocrystal.

For the foregoing reasons, there is a need to improve the current synthetic method of $Cs_4PbBr_6$ perovskite nanocrystal, which is laborious and complex.

SUMMARY

The embodiments of the present invention provide a perovskite luminescent nanocrystal that has a chemical formula represented by $Cs_4BX_6$. The perovskite luminescent nanocrystal has good photothermal stability and high luminous efficiency.

A perovskite luminescent nanocrystal is provided. The perovskite luminescent nanocrystal has a chemical formula represented by: $Cs_4BX_6$, wherein B comprises one or more selected from the group consisting of Ge, Pb, Sn, Sb, Bi, Cu, and Mn, and X comprises one or more selected from the group consisting of Cl, Br, and I, wherein the $Cs_4BX_6$ perovskite luminescent nanocrystal has a pure phase, and a molar ratio of Cs to B (Cs/B) in the $Cs_4BX_6$ perovskite luminescent nanocrystal is greater than 1 and less than 4.

In the foregoing, a size of the perovskite luminescent nanocrystal is smaller than 500 nm.

The invention provides a light emitting device. The light emitting device comprises a light emitting element and a light emitting material. The light emitting element is configured to emit blue light or ultraviolet light. The light emitting material comprises the perovskite luminescent nanocrystal as mentioned above. The light emitting material is excited by the blue light or the ultraviolet light to emit first light rays.

In the foregoing, when the perovskite luminescent nanocrystal is $Cs_4PbBr_6$, the first light rays that are emitted have a peak wavelength ranged from 500 nm to 540 nm and an full width at half maximum (FWHM) from 10 nm to 30 nm.

In the foregoing, the light emitting material further comprises one or more other wavelength converting materials.

In the foregoing, the one or more wavelength converting materials are excited by the blue light or the ultraviolet light to emit second light rays.

In the foregoing, a peak wavelength of the second light rays fall within the red wavelength range.

In the foregoing, the light emitting element is a light emitting diode chip, a sub-millimeter light emitting diode chip, or a micro light emitting diode chip.

The invention further provides a manufacturing method for a perovskite luminescent nanocrystal. The manufacturing method comprises the following steps. First, a cesium oleate precursor is formed. Next, the cesium oleate precursor, a non-polar solvent, and a first nucleating agent are mixed to form a first solution. Then, $BX_2$, a polar solvent, and a second nucleating agent are added to the first solution to form a second solution, wherein B comprises one or more selected from the group consisting of Ge, Pb, Sn, Sb, Bi, Cu, and Mn, and X comprises one or more selected from the group consisting of Cl, Br, and I. After that, the second solution is stirred to form the perovskite luminescent nanocrystal. The perovskite luminescent nanocrystal has a chemical formula represented by: $Cs_4BX_6$, wherein B comprises one or more selected from the group consisting of Ge, Pb, Sn, Sb, Bi, Cu, and Mn, and X comprises one or more selected from the group consisting of Cl, Br, and I, wherein the $Cs_4BX_6$ perovskite luminescent nanocrystal has a pure phase, and a molar ratio of Cs to B (Cs/B) in the $Cs_4BX_6$ perovskite luminescent nanocrystal is greater than 1 and less than 4 after an elemental analysis.

In the foregoing, the step of forming the cesium oleate precursor comprises: dissolving a cesium-containing precursor in oleic acid. The cesium-containing precursor comprises cesium carbonate ($Cs_2CO_3$), cesium bromide (CsBr), cesium oleylamine (Cs—OAm), or cesium oleate (Cs-oleate).

In the foregoing, the second solution is stirred in a nitrogen condition at room temperature to form the perovskite luminescent nanocrystal.

In the foregoing, the step of forming the second solution further comprises adding a solubilizing agent. The solubilizing agent is HX, wherein X is F, Cl, Br, or I.

In the foregoing, each of the first nucleating agent and the second nucleating agent comprises oleic acid, oleylamine, or a combination thereof.

In the foregoing, a polarity difference between the polar solvent and the non-polar solvent is greater than or equal to 3 and less than or equal to 10.

In the foregoing, when the polarity difference between the polar solvent and the non-polar solvent is greater than or equal to 3 and less than 6, the perovskite luminescent nanocrystal having a particle size between 100 nm and 500 nm is formed.

In the foregoing, when the polarity difference between the polar solvent and the non-polar solvent is greater than or equal to 6 and less than or equal to 10, the perovskite luminescent nanocrystal having a particle size between 10 nm and 100 nm is formed.

In the foregoing, the polar solvent is selected from the group consisting of isopropanol, Isobutyl alcohol, tetrafuran, water, acetone, methanol, ethanol, ethylene glycol, n-propanol, n-butanol, ethyl acetate, acetonitrile, dimethyl formamide, and dimethyl sulfoxide. The non-polar solvent is selected from the group consisting of n-pentane, hexane, cyclohexane, benzene, toluene, p-xylene, and chlorobenzene.

In the foregoing, the elemental analysis comprises an energy-dispersive X-ray spectroscopy (EDS) measurement, an inductively coupled plasma atomic emission spectroscopy (ICP-AES) measurement, or an inductively coupled plasma mass spectrometry (ICP-MS) measurement.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the relevant art in the context of the present disclosure, and will not be interpreted in an idealized or overly formal sense unless expressly so defined herein.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

Figure 1:
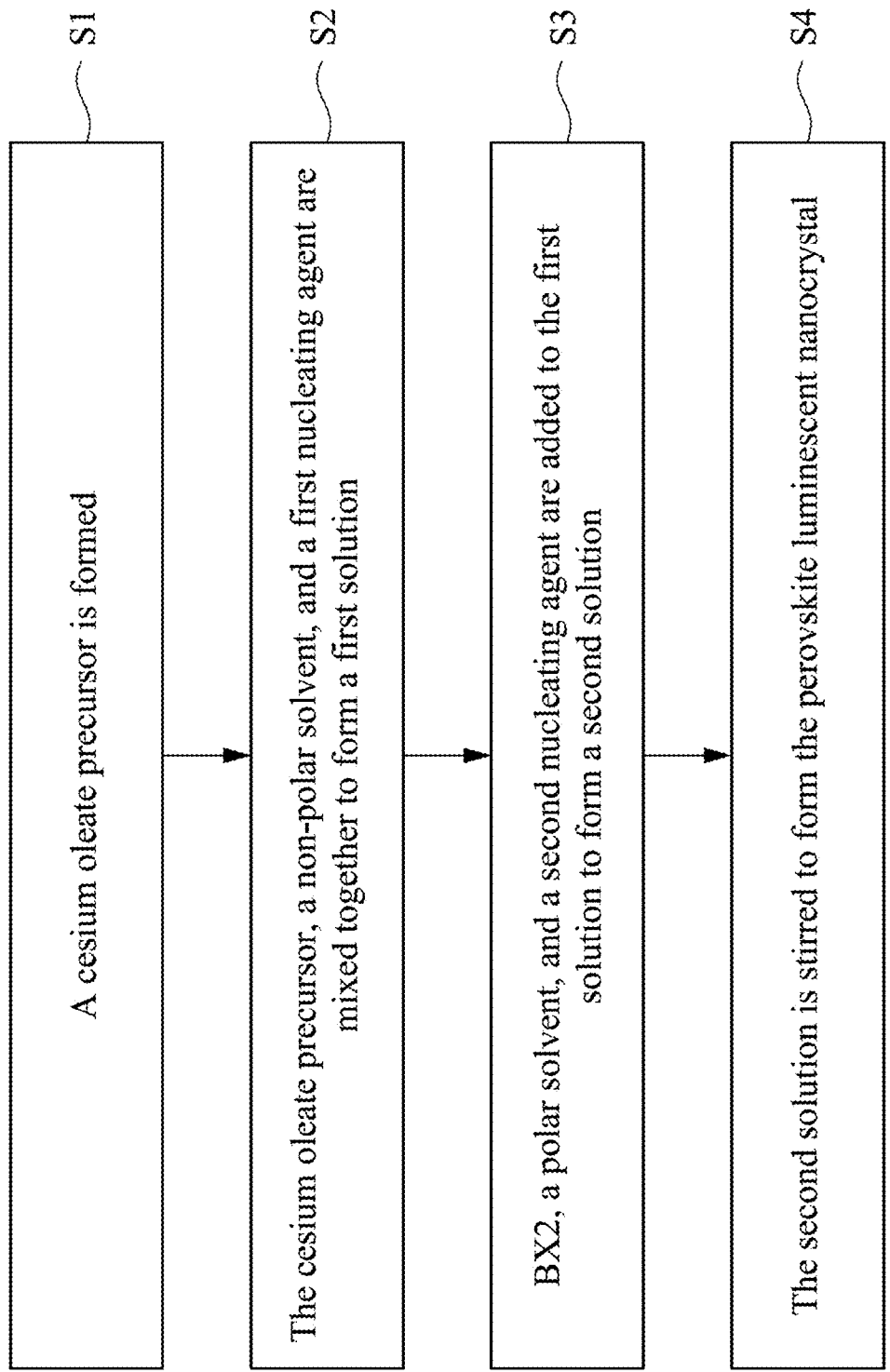
FIG. 1 depicts a flowchart of steps of a manufacturing method for a perovskite luminescent nanocrystal according to one embodiment of this invention.

FIG. 1 is a flowchart illustrating a method 10 for manufacturing a perovskite luminescent nanocrystal according to one embodiment of this invention. As shown in FIG. 1, the manufacturing method 10 comprises steps S1, S2, S3, and S4.

In step S1, a cesium oleate precursor is formed. In greater detail, a cesium-containing precursor is dissolved in oleic acid in some embodiments. For example, the cesium-containing precursor comprises cesium carbonate ($Cs_2CO_3$), cesium bromide (CsBr), cesium oleylamine (Cs—OAm), or cesium oleate (Cs-oleate).

In step S2, the cesium-containing oleic acid precursor, a non-polar solvent, and a first nucleating agent are mixed together to form a first solution. In various embodiments, the non-polar solvent is selected from the group consisting of n-pentane, hexane, cyclohexane, benzene, toluene, p-xylene, and chlorobenzene. In various embodiments, the first nucleating agent comprises oleic acid, oleylamine, or a combination thereof.

In step S3, $BX_2$, a polar solvent, and a second nucleating agent are added to the first solution to form a second solution. Here B comprises one or more selected from the group consisting of germanium (Ge), lead (Pb), tin (Sn), antimony (Sb), bismuth (Bi), copper (Cu), and manganese (Mn), and X comprises one or more selected from the group consisting of chlorine (Cl), bromine (Br), and iodine (I). In various embodiments, the polar solvent is selected from the group consisting of isopropanol, isobutyl alcohol, tetrafuran, water, acetone, methanol, ethanol, ethylene glycol, n-propanol, n-butanol, ethyl acetate, acetonitrile, dimethyl formamide (DMF), and dimethyl sulfoxide. It is noted that a polarity difference between the polar solvent and the non-polar solvent is greater than or equal to 3 and less than or equal to 10 according to the present embodiment. The "polarity difference" refers to a polarity index of the polar solution minus a polarity index of the non-polar solution. In various embodiments, the second nucleating agent comprises oleic acid, oleylamine, or a combination of oleic acid and oleylamine.

Please refer to the polarity indexes of solvents shown in Table 1 as follows, which lists polarity indexes of commonly used polar solvents and non-polar solvents. Therefore, the suitable polar solvent and non-polar solvent can be selected based on the requirement that the polarity difference between the polar solvent and the non-polar solvent is greater than or equal to 3 and less than or equal to 10.

TABLE 1

| Solvent Name | Polarity Index |
|---|---|
| n-pentane | 0 |
| Hexane | 0.06 |
| cyclohexane | 0.1 |
| Toluene | 2.4 |
| p-xylene | 2.5 |
| Chlorobenzene | 2.7 |
| Benzene | 3 |
| Isobutyl alcohol | 3 |
| n-butanol | 3.7 |
| Tetrafuran | 4.2 |
| Ethyl acetate | 4.3 |
| Isopropanol | 4.3 |
| Chloroform | 4.4 |
| Acetone | 5.4 |
| Acetic acid | 6.2 |
| Acetonitrile | 6.2 |
| Dimethyl formamide (DMF) | 6.4 |
| Methanol | 6.6 |
| Ethylene glycol | 6.9 |
| Dimethyl sulfoxide | 7.2 |
| Water | 10.2 |

In some embodiments, the step of forming the second solution may further comprise adding a solubilizing agent. In detail, $BX_2$, the polar solvent, the second nucleating agent, and the solubilizing agent may be added to the first solution so as to form the second solution. For example, the solubilizing agent is HX, wherein X is fluorine (F), chlorine (Cl), bromine (Br), or iodine (I).

In step S4, the second solution is stirred after the step of forming the second solution so as to form the perovskite luminescent nanocrystal. The perovskite luminescent nanocrystal has a chemical formula represented by: $Cs_4BX_6$, wherein B comprises one or more selected from the group consisting of Ge, Pb, Sn, Sb, Bi, Cu, and Mn, and X comprises one or more selected from the group consisting of Cl, Br, and I, wherein the $Cs_4BX_6$ luminescent nanocrystal has a pure phase, and a molar ratio of Cs to B (Cs/B) in the $Cs_4BX_6$ luminescent nanocrystal is greater than 1 and less than 4 after an elemental analysis. The elemental analysis method used may be an energy-dispersive X-ray spectroscopy (EDS) measurement, an inductively coupled plasma atomic emission spectroscopy (ICP-AES) measurement, an inductively coupled plasma mass spectrometry (ICP-MS) measurement, or other element identification methods. In the present embodiment, the second solution can be stirred in a nitrogen condition at room temperature. The room temperature may be from 20° C. to 30° C., for example, may be 22° C., 24° C., 26° C., or 28° C. In one embodiment, when the polarity difference between the polar solvent and the non-polar solvent is greater than or equal to 3 and less than 6, the perovskite luminescent nanocrystal having a particle size between 100 nm and 500 nm can be formed. In another embodiment, when the polarity difference between the polar solvent and the non-polar solvent is greater than or equal to 6 and less than or equal to 10, the perovskite luminescent nanocrystal having a particle size between 10 nm and 100 nm can be formed.

A detailed operation example of a $Cs_4BX_6$ perovskite luminescent nanocrystal manufactured by the micro-emulsion method is provided as follows. First, 6.9 mmol of $Cs_2CO_3$ and 21.5 mL of oleic acid are added to a 50 mL three-necked flask, and water is removed in a vacuum at 130° C. for one hour, and then being placed in a nitrogen atmosphere at a temperature of 130° C. to form a cesium oleate precursor. After that, 1 mL of the cesium oleate precursor, 10 mL of toluene, and 5 mL of oleic acid are added to a 50 mL three-necked flask to form a first solution. Next, after washing the first solution with nitrogen for 30 minutes, 0.15 mmol of $PbX_2$ (wherein X is chlorine (Cl), bromine (Br), and/or iodine (I)), 15 μL of 48% HBr, 0.5 mL of oleic acid, and 0.5 mL of oleylamine are added to form a second solution. The mixture is gently stirred at room temperature of 20° C. to 30° C. in a nitrogen atmosphere for 30 minutes to wait for the formation of the $Cs_4BX_6$ perovskite luminescent nanocrystal. Finally, after centrifuging the solution at 8000 rpm for 6 minutes, the crystal product is reserved in 5 mL of toluene solution.

As mentioned in the above operation example, in one experiment of the present invention, dimethyl formamide (DMF) of Table 1 with a polarity index of about 6.4 is selected as the polar solution, and toluene of Table 1 with a polarity index of about 2.4 is selected as the non-polar solution. The polarity difference between the two is about 4, and the $Cs_4BX_6$ perovskite luminescent nanocrystal having a particle size between 100 nm and 500 nm can be obtained.

One aspect of the present invention is to provide a perovskite luminescent nanocrystal. The perovskite luminescent nanocrystal has a chemical formula represented by: $Cs_4BX_6$, wherein B comprises one or more selected from the group consisting of Ge, Pb, Sn, Sb, Bi, Cu, and Mn, and X comprises one or more selected from the group consisting of Cl, Br, and I. It is noted that the $Cs_4BX_6$ luminescent nanocrystal has a pure phase, and a molar ratio of Cs to B (Cs/B) is greater than 1 and less than 4. The molar ratio of Cs to B (Cs/B) can be obtained by using an energy-dispersive X-ray spectroscopy (EDS), an inductively coupled plasma atomic emission spectroscopy (ICP-AES), an inductively coupled plasma mass spectrometry (ICP-MS), or other element identification methods.

Figure 2B:
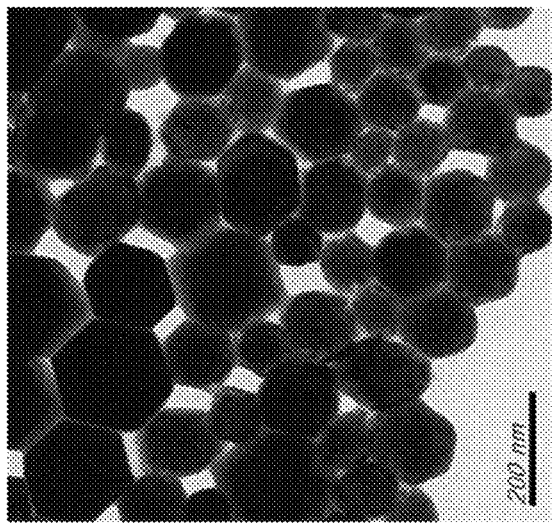
FIG. 2B is a transmission electron microscopy image of a $Cs_4PbBr_6$ perovskite luminescent nanocrystal according to one embodiment of the present invention.
Figure 2A:
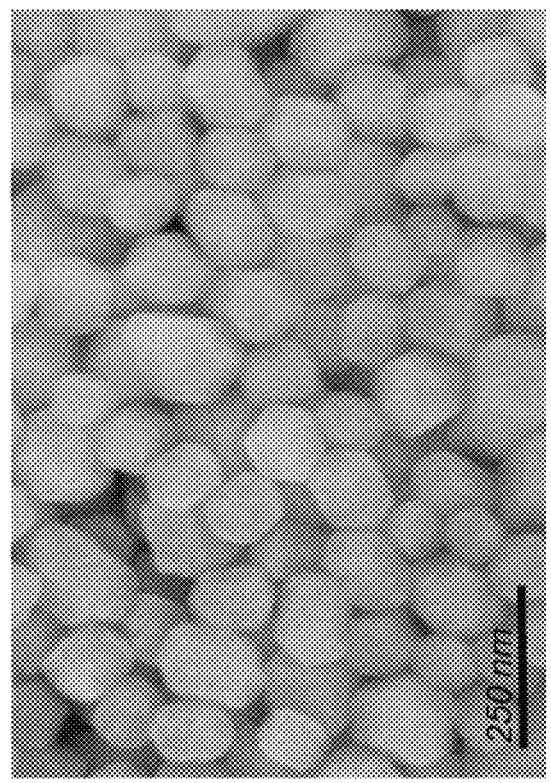
FIG. 2A is a scanning electron microscope image of a $Cs_4PbBr_6$ perovskite luminescent nanocrystal according to one embodiment of the present invention.

FIG. 2A is a scanning electron microscope (SEM) image of a $Cs_4PbBr_6$ perovskite luminescent nanocrystal according to one embodiment of the present invention. FIG. 2B is a transmission electron microscopy (TEM) image of a $Cs_4PbBr_6$ perovskite luminescent nanocrystal according to one embodiment of the present invention. As can be seen from FIG. 2A and FIG. 2B, an average size of the perovskite luminescent nanocrystal is smaller than 500 nm, for example, 100 nm to 500 nm and/or 10 nm to 100 nm.

Figure 2C:
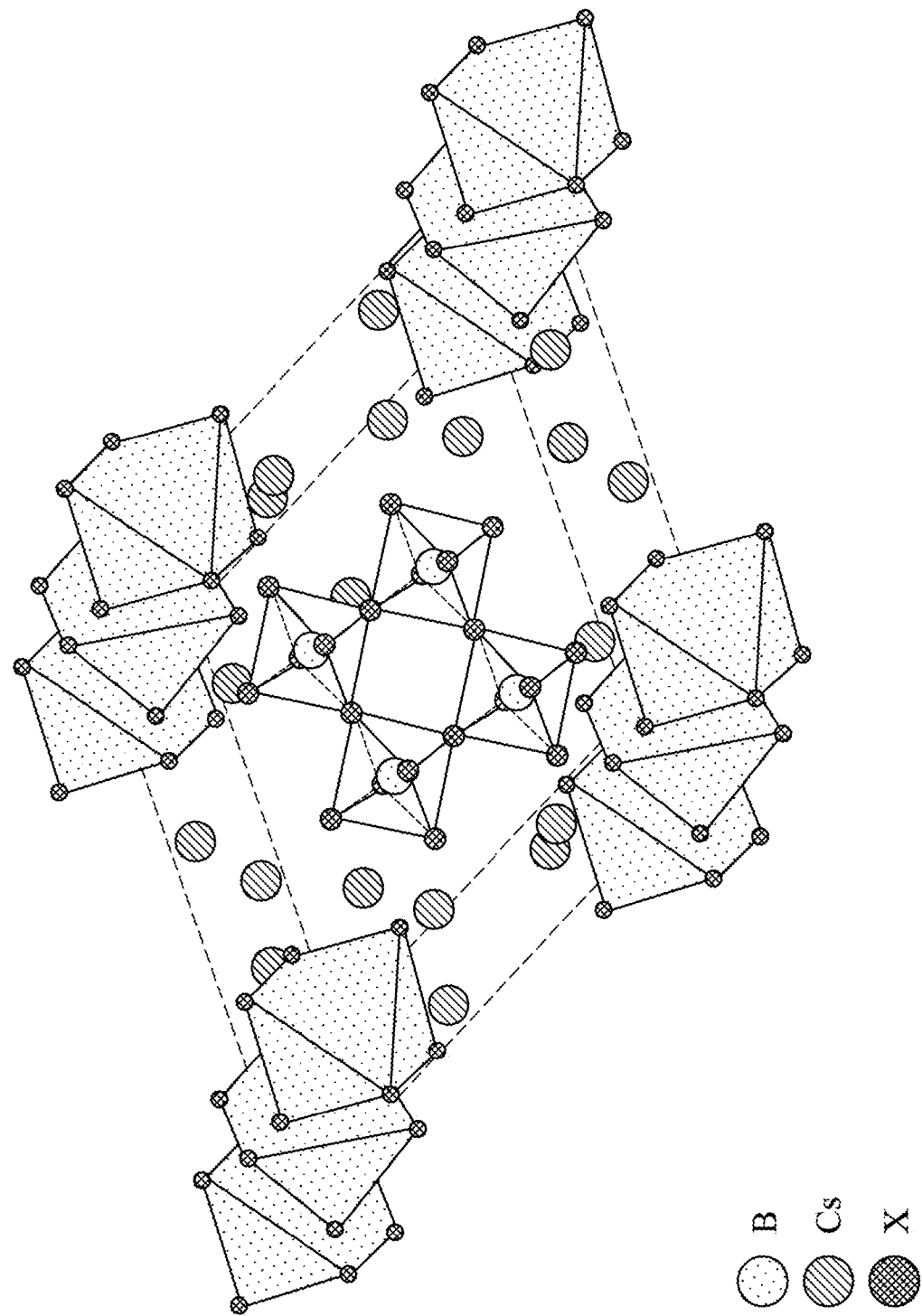
FIG. 2C is a structural model of a $Cs_4PbBr_6$ perovskite luminescent nanocrystal according to one embodiment of the present invention.
Figure 2D:
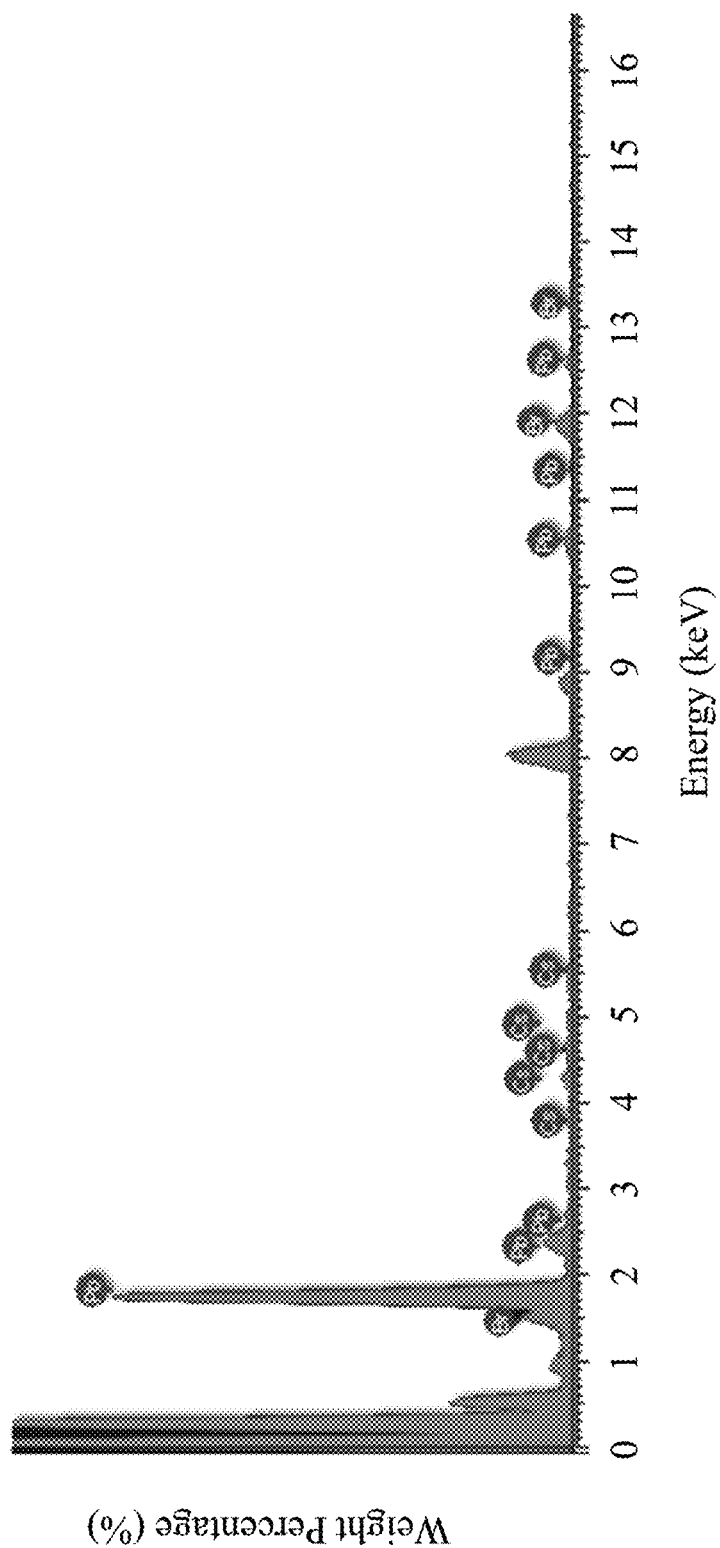
FIG. 2D is an energy-dispersive X-ray spectroscopy diagram of a pure-phase $CsPbBr_3$ perovskite nanocrystal of a comparative example of the present invention.

FIG. 2C depict a structural model of a $Cs_4PbBr_6$ perovskite luminescent nanocrystal according to one embodiment of the present invention. FIG. 2D is an energy-dispersive X-ray spectroscopy (EDS) diagram of a pure phase $CsPbBr_3$ perovskite nanocrystal of a comparative example of the present disclosure. The weight percentage and atomic percentage of each element analyzed based on FIG. 2D are shown in Table 2 as follows.

TABLE 2

| Element Name | Weight Percentage (%) | Atomic Percentage (%) |
| --- | --- | --- |
| Br | 36.97 | 55.76 |
| Cs | 23.38 | 21.19 |
| Pb | 39.65 | 23.05 |
| Sum | 100.00 | — |

Figure 2E:
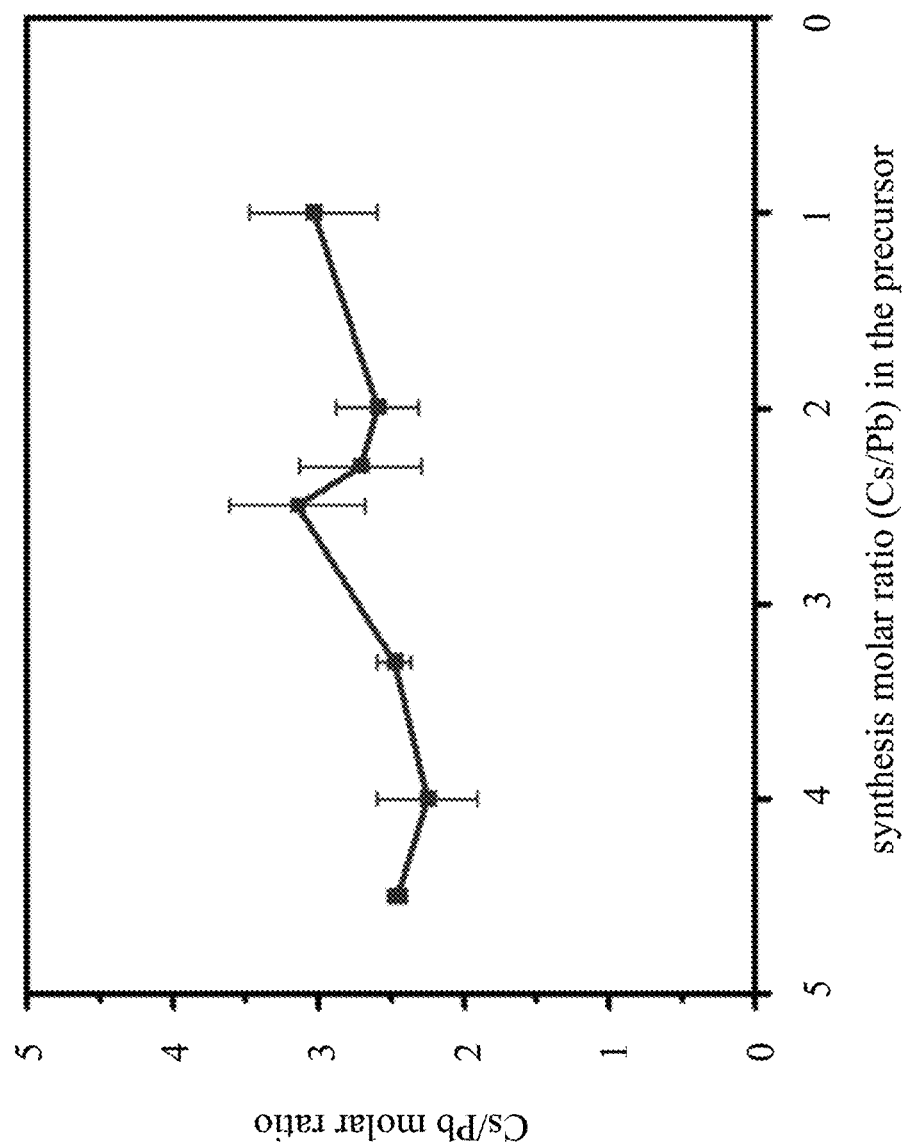
FIG. 2E is a relationship diagram showing a Cs/Pb molar ratio of pure-phase $Cs_4PbBr_6$ at different precursor synthesis ratios and measured by an energy dispersive X-ray spectroscopy according to one embodiment of the present invention.

It is noted that the working principle of energy dispersive X-ray spectroscopy is that different elements emit X-rays of different energies (wavelengths), and X-rays of different energies (wavelengths) are also emitted with transitions between different electron orbitals. For example, the orbital electron of the outer layer of the bromine (Br) atom leaps into the hole of the inner layer orbital (K layer) to emit X-rays. Similarly, the orbital electron of each of the Cs atom and the Pb atom leaps from the outer orbital into the hole of the inner orbit (L layer) to emit X-rays of different energies (wavelengths). As can be seen from FIG. 2D and table 2, the real composition of $CsPbBr_3$ perovskite nanocrystals is $CsPb_{0.9}Br_{2.9}$, which is quite consistent with $CsPbBr_3$. FIG. 2E is a relationship diagram showing a Cs/Pb molar ratio of pure-phase $Cs_4PbBr_6$ at different precursor synthesis ratios, measured by an energy dispersive X-ray spectroscopy according to one embodiment of the present invention. As can be seen by summarizing FIG. 2C to FIG. 2E, the actual molar ratio of Cs to Pb (Cs/Pb) is between 1 and 4 in the $Cs_4PbBr_6$ perovskite luminescent nanocrystal, which is not the theoretical Cs/Pb ratio of 4. This is because of the ratio difference caused by cationic defects in the $Cs_4PbBr_6$ perovskite nanocrystals. The cationic defects may be Cs ion defects, Pb ion defects, or both Cs ion defects and Pb ion defects. The cationic defects will cause the Cs—Pb bonds originally connected between the $PbBr_6^{4-}$ octahedrons to disappear, and induce the neighboring $PbBr_6^{4-}$ octahedrons to gather so as to form three-dimensional halogen-shared $CsPbBr_3$ clusters (also called clusters). Owing to the existence of the $CsPbBr_3$ clusters, the molar ratio of Cs to Pb (Cs/Pb) of the pure-phase $Cs_4PbBr_6$ nanocrystal is greater than 1 and less than 4 after an elemental analysis. The elemental analysis method used may be an energy-dispersive X-ray spectroscopy (EDS) measurement, an inductively coupled plasma atomic emission spectroscopy (ICP-AES) measurement, an inductively coupled plasma mass spectrometry (ICP-MS) measurement, or other element identification methods.

Figure 3:
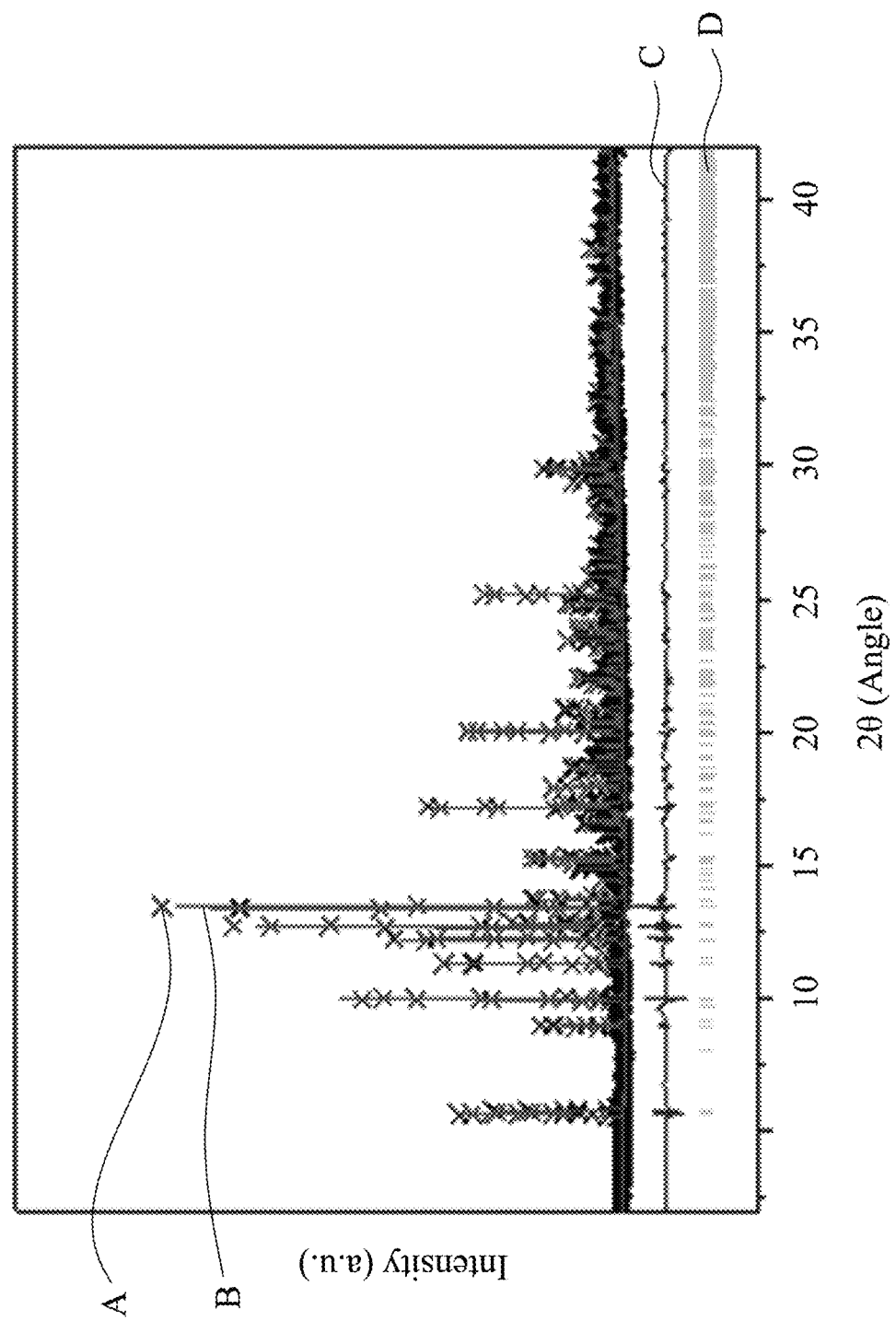
FIG. 3 is a synchrotron X-ray diffraction diagram of a $Cs_4PbBr_6$ perovskite luminescent nanocrystal according to one embodiment of the present invention.

FIG. 3 is a synchrotron X-ray diffraction (XRD) diagram of a $Cs_4PbBr_6$ perovskite luminescent nanocrystal according to the present invention. The data points A in FIG. 3 are diffraction data of the above $Cs_4PbBr_6$ perovskite luminescent nanocrystal synthesized by the micro-emulsion method. Curve B is the fitting curve of the plurality of data points A. Curve C is the difference between the data points A and the curve B. Spectrum D is the standard diffraction spectrum of $Cs_4BX_6$. As can be seen from the XRD diagram of FIG. 3, the $Cs_4PbBr_6$ perovskite luminescent nanocrystal synthesized by the micro-emulsion method does not show any impure phase, and it is thus understood that it is pure-phase $Cs_4PbBr_6$. In addition, through structural calculation, it can be confirmed that the lattice parameters of the $Cs_4PbBr_6$ perovskite luminescent nanocrystal belong to the rhombohedral crystal system (or called the trigonal crystal system), and a=b=13.72939(15) Å, and c=17.31874 (25) Å, here a, b, and c are lengths of three sides of the crystal lattice, which are generally called lengths of axes. In addition, as can be seen from FIG. 3, the $Cs_4PbBr_6$ perovskite luminescent nanocrystal according to the present embodiment is a pure-phase crystal.

Figure 4:
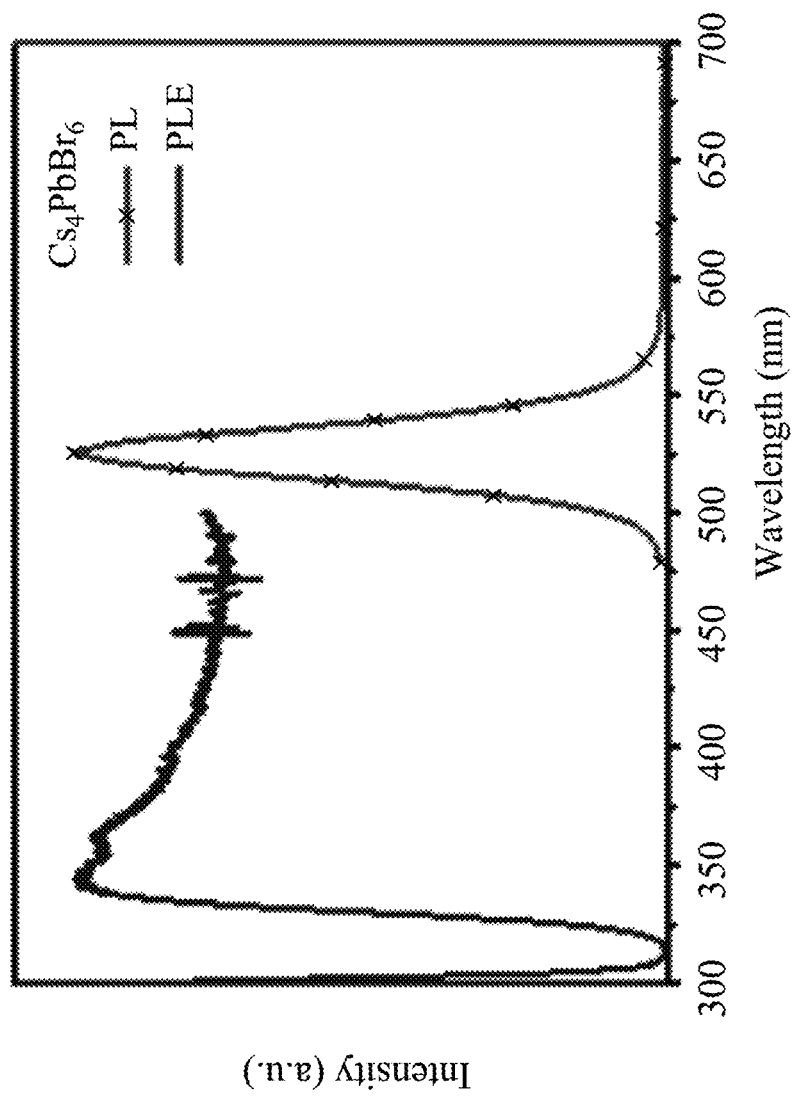
FIG. 4 is a photoluminescence excited spectrum and a photoluminescence emission spectrum of a $Cs_4PbBr_6$ perovskite luminescent nanocrystal according to one embodiment of the present invention.

FIG. 4 is a photoluminescence excited spectrum (PLE) and a photoluminescence emission spectrum (PL) of a $Cs_4PbBr_6$ perovskite luminescent nanocrystal according to the present invention. Curve PLE in FIG. 4 is the photoluminescence excited spectrum of the $Cs_4PbBr_6$ perovskite luminescent nanocrystal, and curve PL is the photoluminescence emission spectrum of the $Cs_4PbBr_6$ perovskite luminescent nanocrystal. As can be seen from FIG. 4, the $Cs_4PbBr_6$ perovskite luminescent nanocrystal has a broad excitation wavelength from 340 nm to 500 nm. The photoluminescence emission spectrum of the $Cs_4PbBr_6$ perovskite luminescent nanocrystal has an emission center wavelength of 525 nm and an FWHM of 26 nm, thus rendering the photoluminescence emission spectrum of the $Cs_4PbBr_6$ perovskite luminescent nanocrystal to present an extremely narrow line spectral structure. That is, the $Cs_4PbBr_6$ perovskite luminescent nanocrystal with an extremely narrow FWHM has extremely high color purity.

Figure 5B:
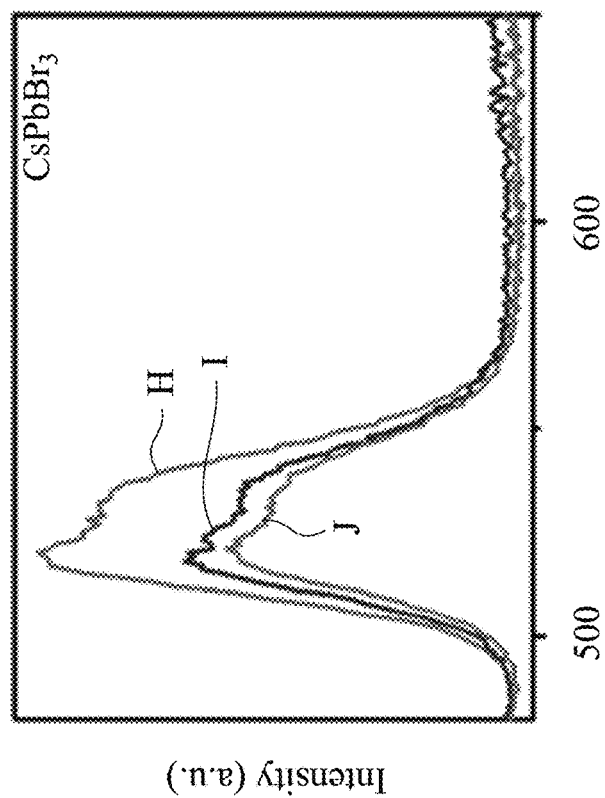
FIG. 5B is temperature-dependent photoluminescence spectra of a $CsPbBr_3$ perovskite luminescent nanocrystal according to a comparative example of the present invention.
Figure 5A:
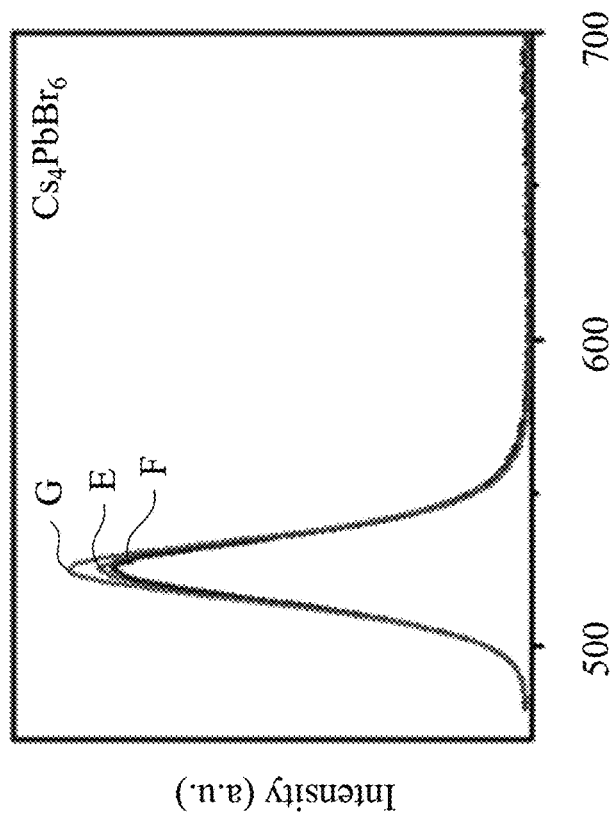
FIG. 5A is temperature-dependent photoluminescence spectra of a $Cs_4PbBr_6$ perovskite luminescent nanocrystal according to one embodiment of the present invention.

FIG. 5A is temperature-dependent photoluminescence spectra (TL) of a $Cs_4PbBr_6$ perovskite luminescent nanocrystal according to the present invention. Curve E in FIG. 5A is the photoluminescence intensity curve of the unbaked $Cs_4PbBr_6$ perovskite luminescent nanocrystal. Curve F is the photoluminescence intensity curve after baking the $Cs_4PbBr_6$ perovskite luminescent nanocrystal at 100° C. for 10 minutes. Curve G is the photoluminescence intensity curve after baking the $Cs_4PbBr_6$ perovskite luminescent nanocrystal at 150° C. for 10 minutes. As can be seen from FIG. 5A, the $Cs_4PbBr_6$ perovskite luminescent nanocrystal after being baked at a high temperature still maintains 97% of the photoluminescence intensity as compared with the curve E of the unbaked $Cs_4PbBr_6$ perovskite luminescent nanocrystal. It is thus understood that the $Cs_4PbBr_6$ perovskite luminescent nanocrystal has excellent heat resistance (or thermal stability).

FIG. 5B is temperature-dependent photoluminescence spectra (TL) of a $CsPbBr_3$ perovskite luminescent nanocrystal according to a comparative example of the present disclosure. Curve H in FIG. 5B is the photoluminescence intensity curve of the unbaked $CsPbBr_3$ perovskite luminescent nanocrystal. Curve I is the photoluminescence intensity curve after baking the $CsPbBr_3$ perovskite luminescent nanocrystal at 100° C. for 10 minutes. Curve J is the photoluminescence intensity curve after baking the $CsPbBr_3$ perovskite luminescent nanocrystal at 150° C. for 10 minutes. As can be seen from FIG. 5B, only 62% of the photoluminescence intensity after the $CsPbBr_3$ perovskite luminescent nanocrystal is baked at a high temperature is left as compared with the curve H of the unbaked $Cs_4PbBr_6$ perovskite luminescent nanocrystal. It is thus understood that the $Cs_4PbBr_6$ perovskite luminescent nanocrystal has better heat resistance (or thermal stability) when compared with the $CsPbBr_3$ perovskite luminescent nanocrystal.

Figure 6:
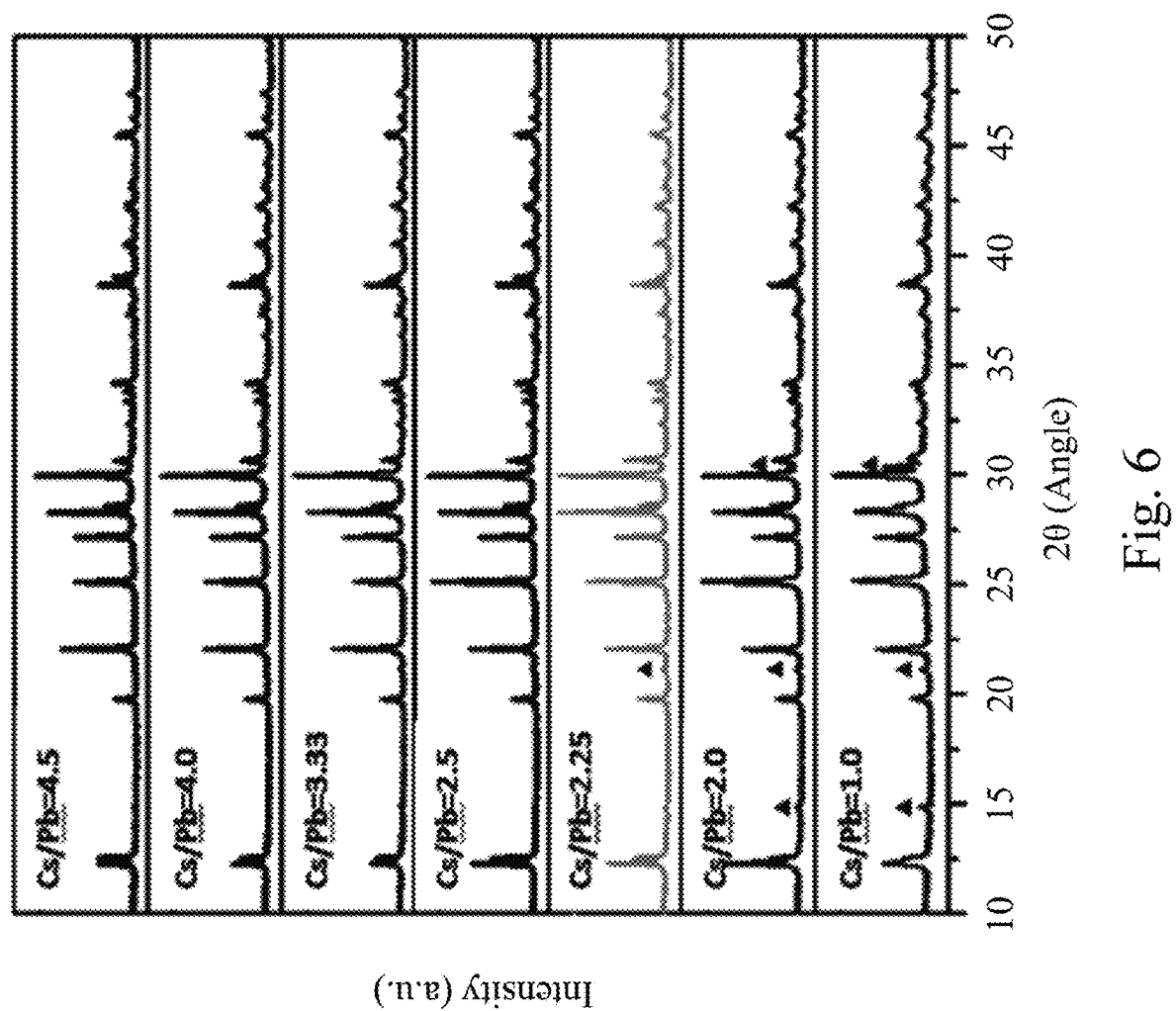
FIG. 6 is X-ray diffraction diagrams of a $Cs_4PbBr_6$ perovskite luminescent nanocrystal varied with a Cs/Pb ratio according to one embodiment of the present invention.

FIG. 6 is X-ray diffraction (XRD) diagrams of a $Cs_4PbBr_6$ perovskite luminescent nanocrystal varied with a Cs/Pb ratio according to the present invention. As can be seen from FIG. 6, the $Cs_4PbBr_6$ perovskite luminescent nanocrystal synthesized with different Cs/Pb ratios does not show any impure phase when the Cs/Pb ratio is greater than or equal to 2.5. It is thus understood that when the Cs/Pb ratio is greater than or equal to 2.5, the $Cs_4PbBr_6$ has a pure phase. When the $Cs_4PbBr_6$ perovskite luminescent nanocrystal is synthesized with a Cs/Pb ratio equal to 2.25, weak diffraction noises can be observed at around 22.4°. After being compared with the standard diffraction data, these noises are diffraction peaks of crystal planes of the $CsPbBr_3$ crystal. When the $Cs_4PbBr_6$ perovskite luminescent nanocrystal is synthesized with a Cs/Pb ratio less than or equal to 2.0, the XRD spectrum shows more obvious diffraction noises at about 15.8°, 22.4° and 31.9°. After being compared with the standard diffraction data, these noises are all diffraction peaks of crystal planes of the $CsPbBr_3$ crystal. It is thus understood that the $Cs_4PbBr_6$ perovskite luminescent nanocrystal of the present invention is pure-phase $Cs_4PbBr_6$ when the Cs/Pb ratio is greater than or equal to 2.5 and less than or equal to 4.5, and is a perovskite luminescent nanocrystal having two phases ($Cs_4PbBr_6$ and $CsPbBr_3$) when the Cs/Pb ratio is less than 2.5.

Figure 7:
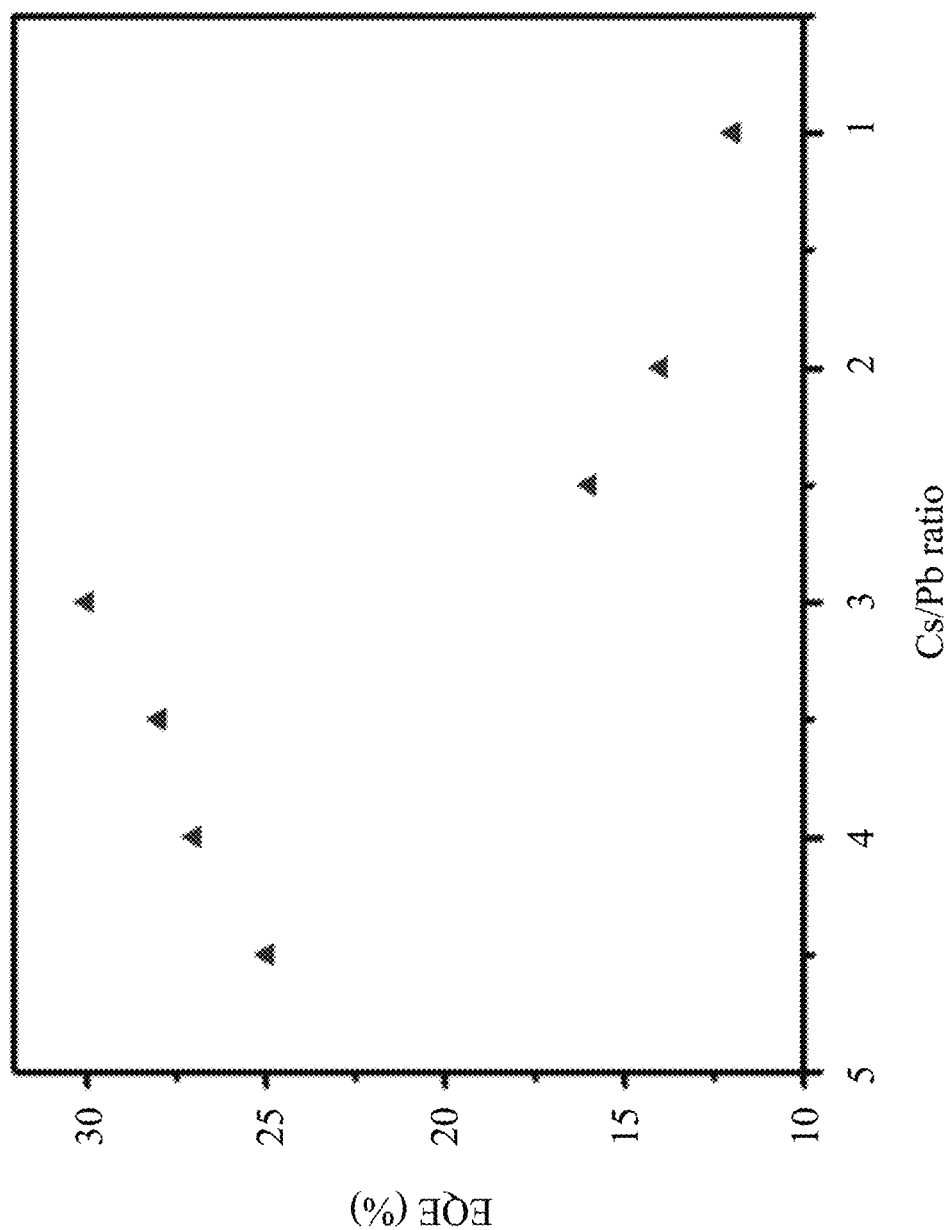
FIG. 7 is an external quantum efficiency diagram of a $Cs_4PbBr_6$ perovskite luminescent nanocrystal varied with a Cs/Pb ratio according to the present invention.

FIG. 7 is an external quantum efficiency (EQE) diagram of a $Cs_4PbBr_6$ perovskite luminescent nanocrystal varied with a Cs/Pb ratio according to the present invention. In greater detail, the external quantum efficiencies of the $Cs_4PbBr_6$ perovskite luminescent nanocrystal having different Cs/Pb ratios are identified under excitation of blue light of 460 nm. As shown in FIG. 7, when the $Cs_4PbBr_6$ perovskite luminescent nanocrystal is synthesized with a Cs/Pb ratio of 4.5, 4.0, 3.5, 3.0, 2.5, 2.0 and 1.0, the external quantum efficiencies of the $Cs_4PbBr_6$ perovskite luminescent nanocrystal are respectively 25.0%, 27.0%, 28.0%, 30.0%, 16.0%, 14.0%, and 12.0%. It is thus understood that when the $Cs_4PbBr_6$ perovskite luminescent nanocrystal is synthesized with a Cs/Pb ratio greater than or equal to 2.5, the external quantum efficiency of the synthesized $Cs_4PbBr_6$ perovskite luminescent nanocrystal is gradually increased as the Cs/Pb ratio is increased. When the $Cs_4PbBr_6$ perovskite luminescent nanocrystal is synthesized with a Cs/Pb ratio less than 2.5, the external quantum efficiency of the synthesized $Cs_4PbBr_6$ perovskite luminescent nanocrystal is rapidly decreased with the decrease of the Cs/Pb ratio.

As can be seen by summarizing the identification results of FIG. 6 and FIG. 7, when the Cs/Pb ratio of the $Cs_4PbBr_6$ perovskite luminescent nanocrystal synthesized by the microemulsion method is greater than 2.5, the crystal continues maintaining the pure phase and the external quantum efficiency is improved with the decrease of the Cs/Pb synthesis ratio. This fact can prove that the three-dimensional halogen(X)-shared $CsPbBr_3$ clusters, which are caused by the inclusion of cationic defects (for example, may be Cs ion defects, or Pb ion defects, or Cs ion defects and Pb ion defects) in the crystals, are indeed the reason for the high efficiency photoluminescence of the $Cs_4PbBr_6$ perovskite luminescent nanocrystals. In addition, when the Cs/Pb ratio of the $Cs_4PbBr_6$ perovskite luminescent nanocrystal is less than or equal to 2.5, the crystals generate the $CsPbBr_3$ impure phase and the external quantum efficiency is rapidly decreased with the decrease of the Cs/Pb synthesis ratio. This fact explains that the luminescence of the $Cs_4PbBr_6$ perovskite luminescent nanocrystal is not caused by generation of the $CsPbBr_3$ impure phase.

Figure 8:
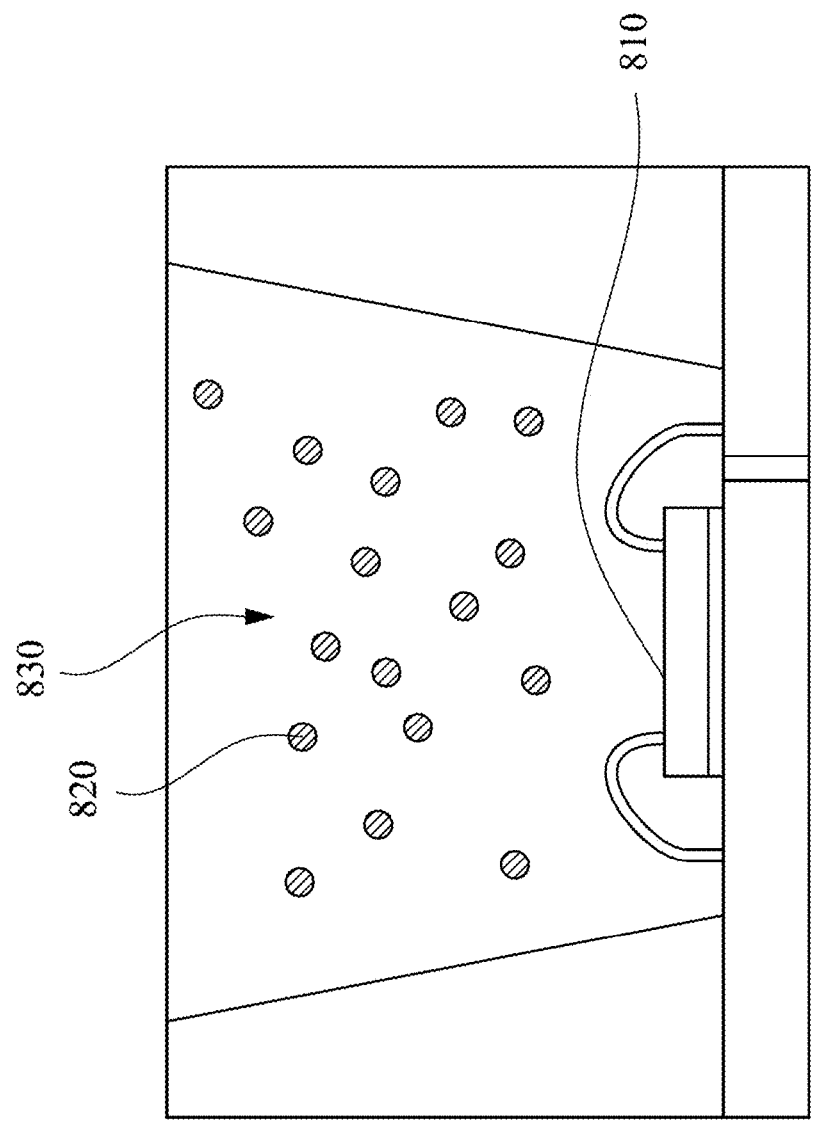
FIG. 8 depicts a cross-sectional schematic diagram of a light emitting device according to some embodiments of the present invention.

FIG. 8 depicts a cross-sectional schematic diagram of a light emitting device 800 according to some embodiments of the present invention. As shown in FIG. 8, the light emitting device 800 comprises a light emitting element 810 and a light emitting material 820. In greater detail, the light emitting element 810 can emit blue light or ultraviolet light. For example, the light emitting element 810 may be a light emitting diode chip, a sub-millimeter light emitting diode chip (mini LED chip), or a micro light emitting diode chip (micro LED chip), which can emit blue light having an excitation wavelength from about 420 nm to about 480 nm or ultraviolet light having an excitation wavelength from about 200 nm to about 400 nm. The sub-millimeter light emitting diode chip and the micro light emitting diode chip are smaller than the general light emitting diode chip, for example, the size of the sub-millimeter light emitting diode chip is between about 100 micrometers and about 500 micrometers, and the size of the micro light emitting diode chip is below about 100 micrometers. The light emitting material 820 may comprise the perovskite luminescent nanocrystal as mentioned previously, which receives the blue light or ultraviolet light emitted by the light emitting element 810 to emit first light rays. In greater detail, when the perovskite luminescent nanocrystal is $Cs_4PbBr_6$, the first light rays that are emitted have a peak wavelength ranged from 500 nm to 540 nm and an FWHM from 10 nm to 30 nm in various embodiments. Since details of the perovskite luminescent nanocrystal are similar to the foregoing, a description in this regard is not provided.

In some embodiments, the light emitting material 820 may further comprise one or more other wavelength converting materials. In greater detail, the light emitting material 820 comprises an inorganic fluorescent powder and an organic fluorescent powder. In greater detail, the inorganic fluorescent powder may be an aluminate fluorescent powder (such as LuYAG, GaYAG, or YAG, etc.), a silicate fluorescent powder, a sulfide fluorescent powder, a nitride fluorescent powder, an oxide fluorescent powder, or a fluoride fluorescent powder, but the present invention is not limited in this regard. The organic fluorescent powder may be selected from a monomolecular structure, a multimolecular structure, an oligomer, or a polymer composed of one or more of the following compounds. Each of the compounds has a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group and/or a benzimidazole group.

For example, a red fluorescent powder material may be, for example, a manganese-doped red fluoride fluorescent powder that is one or more fluorescent powders selected from the group consisting of the following: (A) $A_2[MF_6]$:$Mn^{4+}$, wherein A is one or more selected from Li, Na, K, Rb, Cs, and NH4, and M comprises one or more selected from Ge, Si, Sn, Ti, and Zr; and (B) $A_3[MF_6]$: $Mn^{4+}$, wherein A is selected from one or more of Li, Na, K, Rb, Cs, and NH4, and M comprises one or more selected from Al, Ga, and In.

In some embodiments, the above one or more wavelength converting materials receive the blue light or ultraviolet light emitted by the light emitting element 810 to emit second light rays. For example, a peak wavelength of the second light rays fall within the red wavelength range.

In various embodiments, the light emitting device 800 may further comprise an encapsulation material 830, and the light emitting material 820 is dispersed in the encapsulation material 830. In greater detail, a material of the encapsulation material 830 may comprise one or more combinations selected from polymethyl methacrylate (PMMA), polyethylene terephthalate (PET), polystyrene (PS), polyethylene (PP), polyamide (PA), polycarbonate (PC), polyimide (PI), polydimethylsiloxane (PDMS), epoxy, and silicone, etc.

In one embodiment, green $Cs_4BX_6$ perovskite luminescent nanocrystals (for example, $Cs_4PbBr_6$), red $K_2SiF_6$:$Mn^{4+}$ fluorescent powder, and AB glue for encapsulation are mixed and then dispensed on a blue chip. After curing, the photoluminescence spectrum and color coordinates are measured. The color coordinates in the CIE 1931 XYZ color space are (0.27, 0.24) and the gamut area reaches 129% of NTSC (National Television System Committee). It can be seen that the $Cs_4BX_6$ perovskite luminescent nanocrystal is a very promising light emitting material at the application end of the backlit displays.

In summary, the manufacturing method for the perovskite luminescent nanocrystal according to the present invention synthesizes the pure-phase $Cs_4BX_6$ perovskite crystal once. As compared with the common manufacturing method for the perovskite luminescent nanocrystal, it is simpler and more convenient. The perovskite luminescent nanocrystal according to the present invention has good photo-thermal stability and high luminous efficiency. In addition, when the perovskite luminescent nanocrystal described above is applied to a blue light emitting diode or an ultraviolet light emitting diode, it can be used as a light emitting device with high color purity and high quality, which in turn can be applied in a backlit display.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A perovskite luminescent nanocrystal represented by a chemical formula of:

wherein B comprises one or more selected from the group consisting of Ge, Pb, Sn, Sb, Bi, Cu, and Mn, and X comprises one or more selected from the group consisting of Cl, Br, and I, wherein the $Cs_4BX_6$ perovskite luminescent nanocrystal has a pure phase, and a molar ratio of Cs to B (Cs/B) in the $Cs_4BX_6$ perovskite luminescent nanocrystal is greater than 1 and less than 4.

2. The perovskite luminescent nanocrystal of claim 1, wherein a size of the perovskite luminescent nanocrystal is smaller than 500 nm.

3. A light emitting device comprising:
a light emitting element configured to emit blue light or ultraviolet light; and
a light emitting material, wherein the light emitting material comprises the perovskite luminescent nanocrystal of claim 1, and the light emitting material is excited by the blue light or the ultraviolet light to emit first light rays.

4. The light emitting device of claim 3, wherein when the perovskite luminescent nanocrystal is $Cs_4PbBr_6$, the first light rays have a peak wavelength ranged from 500 nm to 540 nm and an FWHM ranged from 10 nm to 30 nm.

5. The light emitting device of claim 3, wherein the light emitting material further comprises one or more other wavelength converting materials.

6. The light emitting device of claim 5, wherein the one or more wavelength converting materials are excited by the blue light or the ultraviolet light to emit second light rays.

7. The light emitting device of claim 6, wherein a peak wavelength of the second light rays fall within a red wavelength range.

8. The light emitting device of claim 3, wherein the light emitting element is a light emitting diode chip, a sub-millimeter light emitting diode chip, or a micro light emitting diode chip.

9. A manufacturing method for a perovskite luminescent nanocrystal comprising steps of:
forming a cesium (Cs)-containing oleic acid precursor;
mixing the cesium-containing oleic acid precursor, a non-polar solvent, and a first nucleating agent to form a first solution;
adding $BX_2$, a polar solvent, and a second nucleating agent to the first solution to form a second solution, wherein B comprises one or more selected from the group consisting of Ge, Pb, Sn, Sb, Bi, Cu, and Mn, and X comprises one or more selected from the group consisting of Cl, Br, and I; and
stirring the second solution to form a perovskite luminescent nanocrystal represented by a chemical formula of:

$Cs_4BX_6$, wherein B comprises one or more selected from the group consisting of Ge, Pb, Sn, Sb, Bi, Cu, and Mn, and X comprises one or more selected from the group consisting of Cl, Br, and I, wherein the $Cs_4BX_6$ perovskite luminescent nanocrystal has a pure phase, and a molar ratio of Cs to B (Cs/B) in the $Cs_4BX_6$ perovskite luminescent nanocrystal is greater than 1 and less than 4 by using an elemental analysis.

10. The manufacturing method of claim 9, wherein the step of forming the cesium oleate precursor comprises:
dissolving a cesium-containing precursor in oleic acid, wherein the cesium-containing precursor comprises cesium carbonate, cesium bromide, cesium oleylamine, or cesium oleate.

11. The manufacturing method of claim 9, wherein the second solution is stirred in a nitrogen condition at a room temperature to form the perovskite luminescent nanocrystal.

12. The manufacturing method of claim 9, wherein the step of forming the second solution further comprises adding a solubilizing agent, and the solubilizing agent is HX, wherein X is F, Cl, Br, or I.

13. The manufacturing method of claim 9, wherein each of the first nucleating agent and the second nucleating agent comprises oleic acid, oleylamine, or a combination thereof.

14. The manufacturing method of claim 9, wherein a polarity difference between the polar solvent and the non-polar solvent is greater than or equal to 3 and less than or equal to 10.

15. The manufacturing method of claim 14, wherein when the polarity difference between the polar solvent and the non-polar solvent is greater than or equal to 3 and less than 6, the perovskite luminescent nanocrystal has a particle size between 100 nm and 500 nm is formed.

16. The manufacturing method of claim 14, wherein when the polarity difference between the polar solvent and the non-polar solvent is greater than or equal to 6 and less than or equal to 10, the perovskite luminescent nanocrystal has a particle size between 10 nm and 100 nm is formed.

17. The manufacturing method of claim 9, wherein the polar solvent is selected from the group consisting of isopropanol, Isobutyl alcohol, tetrafuran, water, acetone, methanol, ethanol, ethylene glycol, n-propanol, n-butanol, ethyl acetate, acetonitrile, dimethyl formamide, and dimethyl sulfoxide, and the non-polar solvent is selected from the group consisting of n-pentane, hexane, cyclohexane, benzene, toluene, p-xylene, and chlorobenzene.

18. The manufacturing method of claim 9, wherein the elemental analysis comprises an energy-dispersive X-ray spectroscopy measurement, an inductively coupled plasma atomic emission spectroscopy measurement, or an inductively coupled plasma mass spectrometry measurement.

* * * * *